US011855141B2

(12) United States Patent
Yeh et al.

(10) Patent No.: US 11,855,141 B2
(45) Date of Patent: Dec. 26, 2023

(54) LOCAL EPITAXY NANOFILMS FOR NANOWIRE STACK GAA DEVICE

(71) Applicant: Taiwan Semiconductor Manufacturing Co., Ltd., Hsinchu (TW)

(72) Inventors: Ling-Yen Yeh, Hsinchu (TW); Meng-Hsuan Hsiao, Hsinchu (TW); Yuan-Chen Sun, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 256 days.

(21) Appl. No.: 17/223,273

(22) Filed: Apr. 6, 2021

(65) Prior Publication Data

US 2021/0226005 A1    Jul. 22, 2021

Related U.S. Application Data

(62) Division of application No. 16/405,698, filed on May 7, 2019, now Pat. No. 11,043,556.

(51) Int. Cl.
*H01L 29/06* (2006.01)
*H01L 29/423* (2006.01)
(Continued)

(52) U.S. Cl.
CPC .... *H01L 29/0673* (2013.01); *H01L 21/02164* (2013.01); *H01L 21/02532* (2013.01);
(Continued)

(58) Field of Classification Search
CPC . H01L 29/0646; H01L 21/265; H01L 21/761; H01L 23/5223; H01L 23/5227;
(Continued)

(56) References Cited

U.S. PATENT DOCUMENTS 8,415,718 B2    4/2013    Xu
8,759,943 B2    6/2014    Tseng et al.
(Continued)

FOREIGN PATENT DOCUMENTS

| CN | 103999226 A | 8/2014 |
| CN | 104979211 A | 10/2015 |
| EP | 3112316 A1 | 1/2017 |

OTHER PUBLICATIONS

Brehm et al., "Ultra-steep side facets in multi-faceted SiGe/Si(OO I) Stranski-Krastanow islands," Nanoscale Research 6:70, 2011. (8 pages).
(Continued)

*Primary Examiner* — Thanhha S Pham
(74) *Attorney, Agent, or Firm* — Slater Matsil, LLP

(57) ABSTRACT

The disclosed technique forms epitaxy layers locally within a trench having angled recesses stacked in the sidewall of the trench. The sizes of the recesses are controlled to control the thickness of the epitaxy layers to be formed within the trench. The recesses are covered by cap layers and exposed one by one sequentially beginning from the lowest recess. The epitaxy layers are formed one by one within the trench with the facet edge portion thereof aligned into the respective recess, which is the recess sequentially exposed for the epitaxy layer.

20 Claims, 11 Drawing Sheets

(51) Int. Cl.
| | |
|---|---|
| *H01L 21/8238* | (2006.01) |
| *H01L 29/10* | (2006.01) |
| *H01L 27/092* | (2006.01) |
| *H01L 29/167* | (2006.01) |
| *H01L 21/762* | (2006.01) |
| *H01L 21/3105* | (2006.01) |
| *H01L 21/02* | (2006.01) |

(52) U.S. Cl.
CPC .. *H01L 21/31051* (2013.01); *H01L 21/76224* (2013.01); *H01L 21/823807* (2013.01); *H01L 21/823821* (2013.01); *H01L 21/823878* (2013.01); *H01L 21/823892* (2013.01); *H01L 27/0924* (2013.01); *H01L 29/0649* (2013.01); *H01L 29/1037* (2013.01); *H01L 29/167* (2013.01); *H01L 29/42392* (2013.01)

(58) Field of Classification Search
CPC . H01L 23/5286; H01L 24/05; H01L 27/0676; H01L 28/10; H01L 28/20; H01L 28/40; H01L 28/60; H01L 2224/48463
See application file for complete search history.

(56) References Cited

U.S. PATENT DOCUMENTS

| | | | |
|---|---|---|---|
| 9,202,915 | B2 | 12/2015 | Xu |
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,583,491 | B2 | 2/2017 | Kim et al. |
| 9,608,116 | B2 | 3/2017 | Ching et al. |
| 9,735,269 | B1 | 8/2017 | Cheng et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2013/0248948 | A1 | 9/2013 | Ma et al. |
| 2018/0108751 | A1 | 4/2018 | Cheng et al. |
| 2019/0081155 | A1 | 3/2019 | Xie et al. |
| 2019/0122937 | A1* | 4/2019 | Cheng ............ H01L 21/823857 |

OTHER PUBLICATIONS

Buzea et al., "State of the art in thin film thickness and deposition rate monitoring sensors," Rep. Prog,. Phvs. 68:385-409, 2005.

Chao et al., "Impact of Geometry Aspect Ratio on 10-nm Gate-All-Around Silicon-Germanium Nanowire Field Effect Transistors," 14th IEEE International Conference on Nanotechnology, Toronto, Canada, Aug. 18-21, 2014, pp. 452-455.

Dutarte et al., "Facet Propagation in Si and SiGe Epitaxy or Etching," ECS Transactions 3(7):473-487, 2006.

Lu et al., "Investigation of film-thickness determination by oscillating quartz resonators with large mass load," Journal of Applied Physics 43(11):4385, 1972. (7 pages).

Luoh et al., "Stress Release for Shallow Trench Isolation by Single-Wafer, Rapid-Thermal Steam Oxidation," 10th IEEE International Conference on Advanced Thermal Processing of Semiconductors, Vancouver, BC, Canada, Sep. 25-27, 2002, pp. 111-118.

Mertens et al., "Gate-All-Around MOSFETs based on Vertically Stacked Horizontal Si Nanowires in a Replacement Metal Gate Process on Bulk Si Substrates," IEEE Symposium on VLSi Technolo;<_y, Honolulu, Hawaii, Jun. 14-16, 2016. (2 pages).

Mertens et al., "Vertically Stacked Gate-All-Around Si Nanowire Transistors: Key Process Optimizations and Ring Oscillator Demonstration," IEEE International Electron Devices Meeting (IEDM), San Francisco, California, Dec. 2-6, 2017, pp. 37.4.1-37.4.4. (4 pages).

Nandakumar et al., "Shallow Trench Isolation for advanced ULSI CMOS Technologies," International Electron Devices Meeting, San Francisco, California, Dec. 6-9, 1998, pp. 6.1.1-6.1.1. (4 pages).

Ru et al., "Rectifying characteristics of sputter-deposited SiGe diodes," J Vac. Sci. Technol. B 21(4): 1301-1305, 2003.

Tromp et al., "Advances in In Situ Ultra-High Vacuum—Electron Microscopy: Growth of SiGe on Si," Annu. Rev. Mater. Sci. 30:431-449, 2000. (28 pages).

Zhang et al. "Modeling Short-Channel Effect of Elliptical Gate-All-Around MOSFET by Effective Radius," IEEE Electron Device Letters 32(9): 1188-1190, 2011.

* cited by examiner

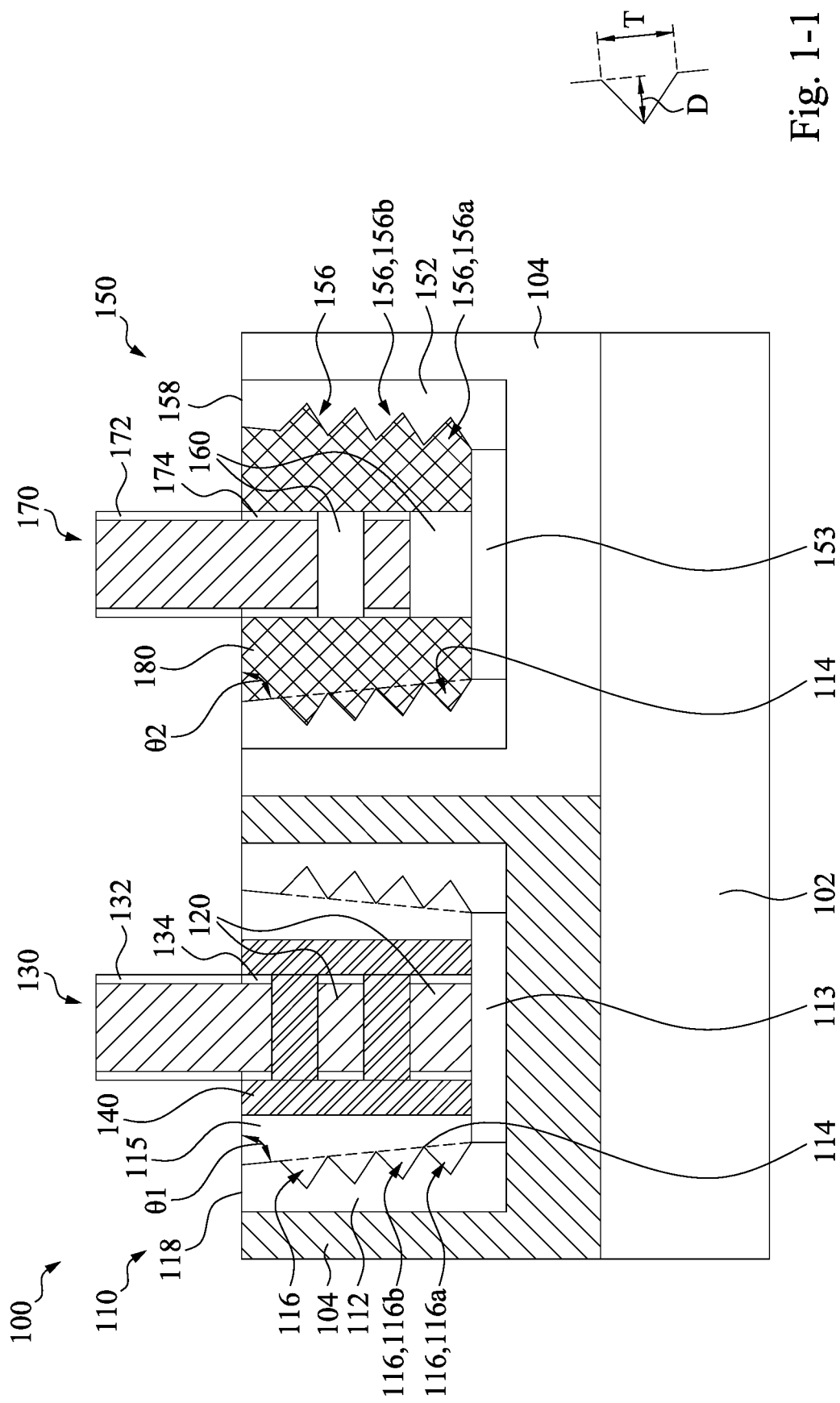

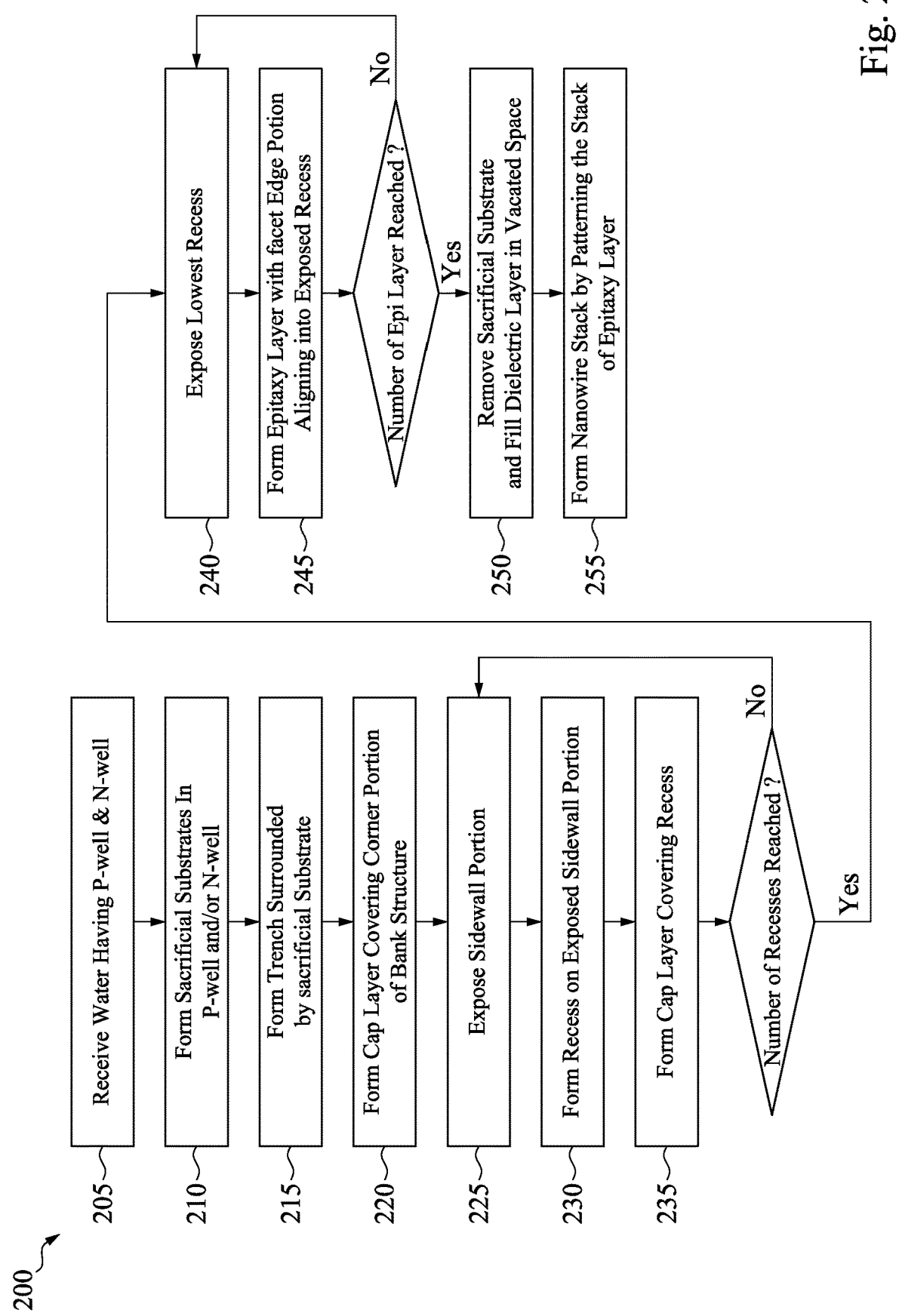

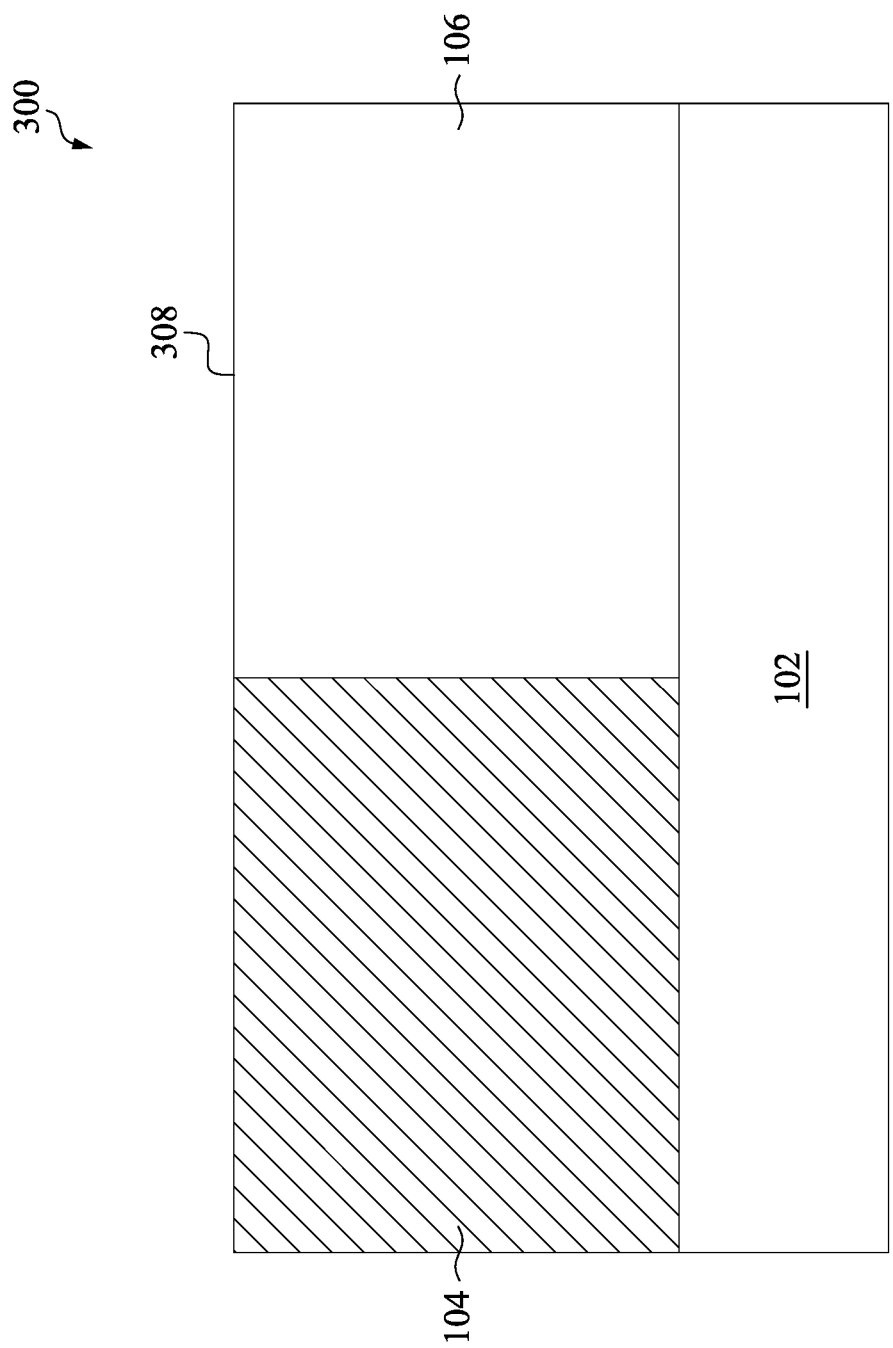

LOCAL EPITAXY NANOFILMS FOR NANOWIRE STACK GAA DEVICE

PRIORITY CLAIM AND CROSS-REFERENCE

This application is a divisional of U.S. patent application Ser. No. 16/405,698, filed on May 7, 2019, now U.S. Pat. No. 11,043,556, issued Jun. 22, 2021, which application is hereby incorporated herein by reference.

BACKGROUND

Complementary metal oxide semiconductor (CMOS) transistors are building blocks for integrated circuits. Faster CMOS switching speed requires higher drive current, which drives the gate lengths of CMOS transistors being continuously scaled down. Shorter gate length leads to undesirable "short-channel effects," in which the current control function of the gates are compromised. FinFET transistors have been developed to, among other things, overcome the short-channel effects. As a further step toward improving the electrostatic control of the channels, transistors having wrapped-around gates have been developed, in which a gate portion may surround a semiconductor channel or channel strip from the upper surface, lower surface and sidewall thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIG. 1 is a cross-sectional view of an example integrated circuit (IC);

FIG. 1-1 is an enlarged view of a portion of FIG. 1;

FIG. 2 is a flow diagram of an example process; and

FIGS. 3A-3M are cross-sectional views of a wafer in various stages of an example process of making a nanowire stack.

DETAILED DESCRIPTION

Figure 3B:
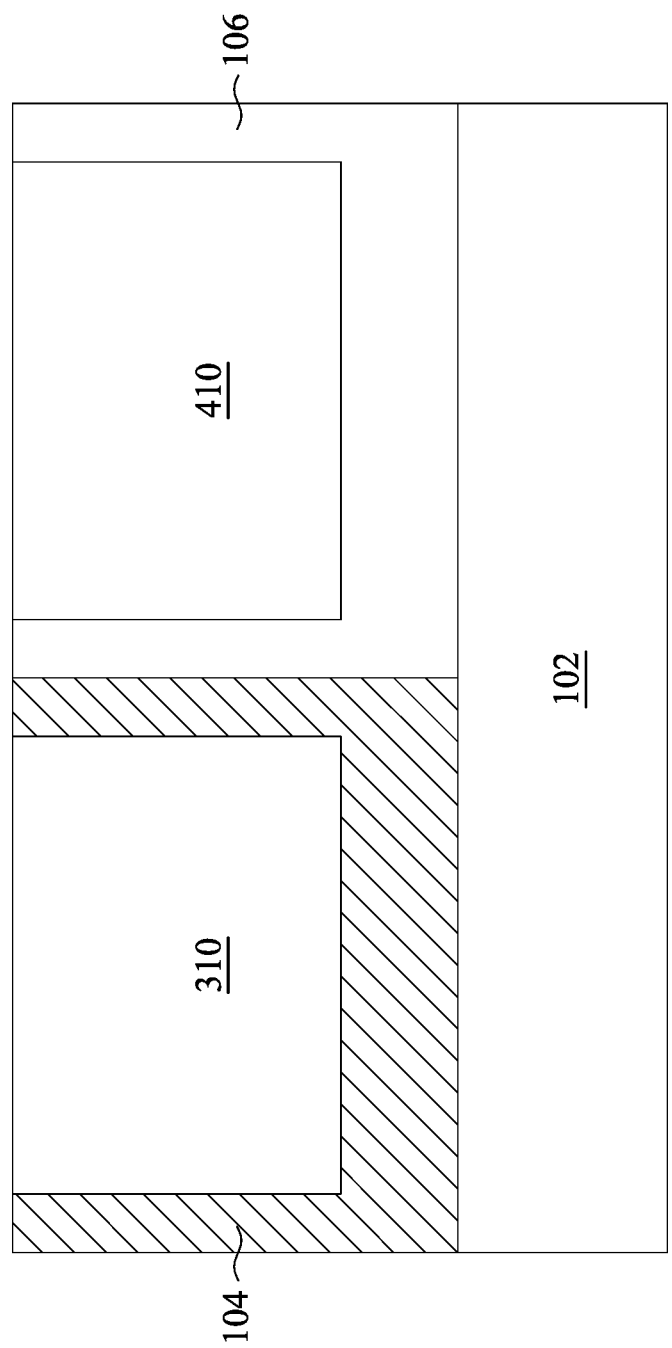

The current disclosure describes techniques for forming a gate-all-around device from a stack of locally formed nanowire semiconductor strips. The inventors have observed that in local growth of epitaxy layers within a defined space, like a trench, the facet edge portions of epitaxy layers may deteriorate the overall quality of the epitaxy layers. For example, the facet edge portion of a lower epitaxy layer makes an upper epitaxy layer to be formed following the angled facet edge portion of the lower epitaxy layer, which in combination with the facet edge portion of the upper epitaxy layer, causes further epitaxy growth inferiorities. The disclosed technique forms epitaxy layers within a trench having angled recesses stacked in the sidewall of the trench. The sizes of the recesses are selected to control the thickness of the epitaxy layers to be formed within the trench. The recesses are covered by cap layers and exposed one by one sequentially beginning from the lowest recess. The epitaxy layers are formed one by one within the trench with the facet edge portion thereof aligned into the respective recess, which is the recess sequentially exposed for the epitaxy layer. The epitaxy process includes an etch component to restrain formation of the epitaxy layer vertically beyond the exposed recess. As such, no epitaxy layer is formed adjacent to the cap layers. The epitaxy formation also includes a dynamic feedback control of the thickness to enhance the accuracy of the epitaxy layer thickness. The resultant epitaxy layers each includes a facet edge portion aligned into the respective recess and extending substantially flat throughout the trench and with desired thickness. The locally formed epitaxy layers are patterned to form nanowire stacks. Gate-all-around (GAA) transistors are formed from the locally formed nanowire stacks. As the epitaxy layers are locally formed, the thickness of the stacked nanowire strips are optimized locally and individually for each type of transistor.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3C:
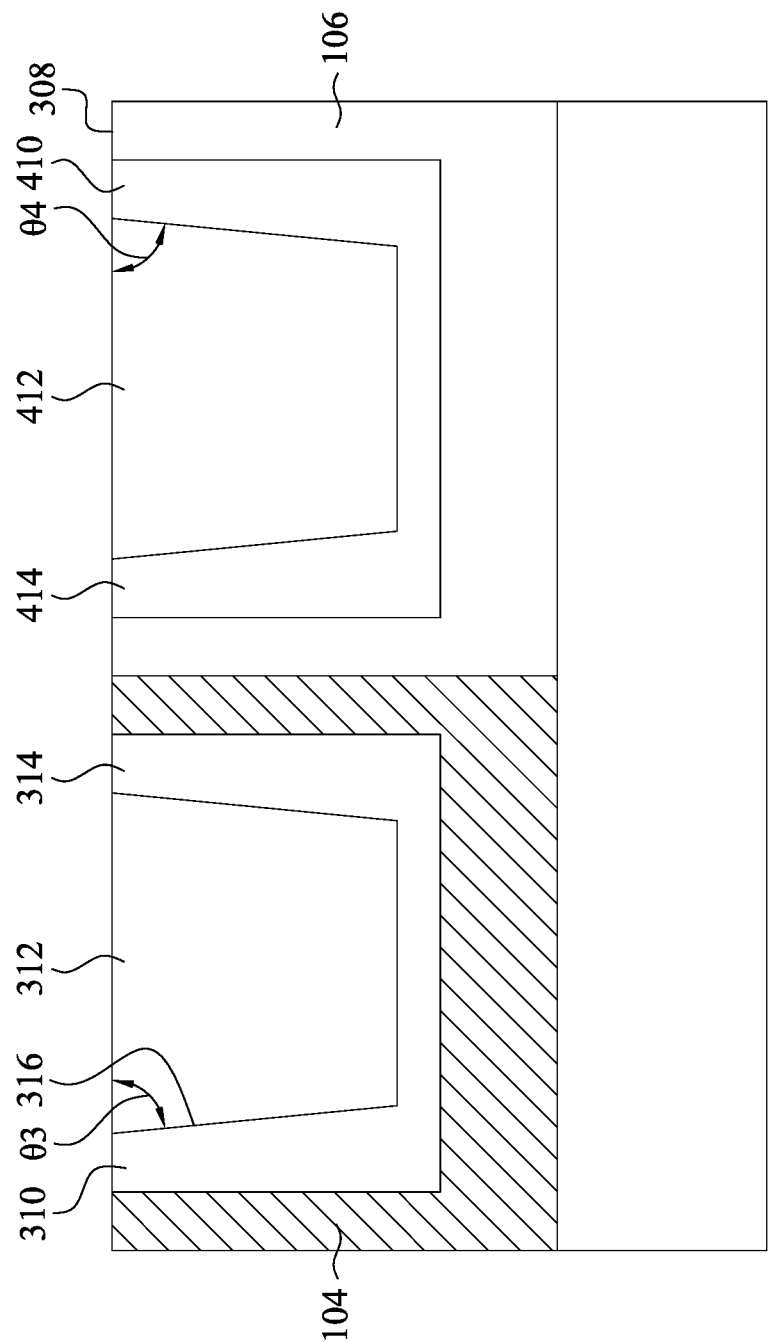
Figure 3D:
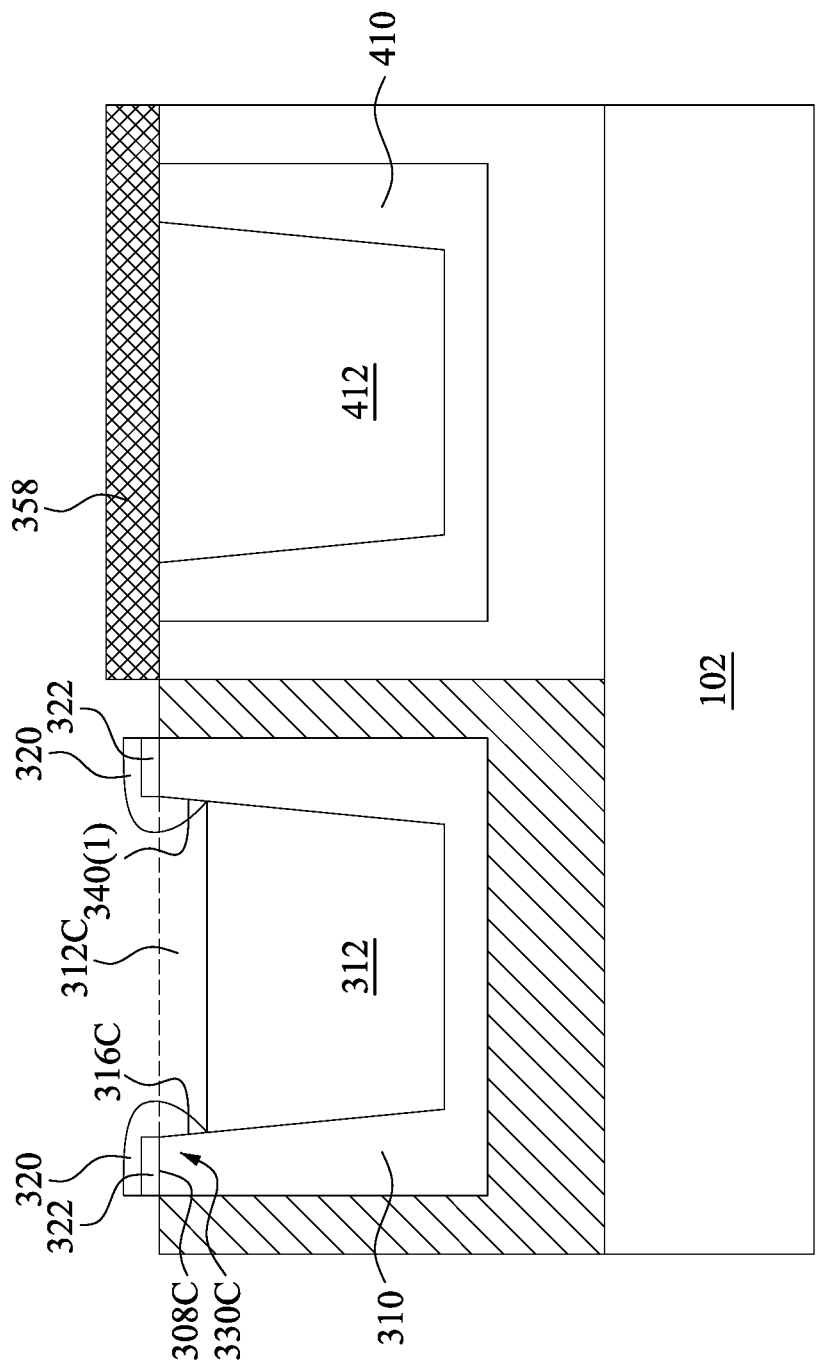
Figure 3F:
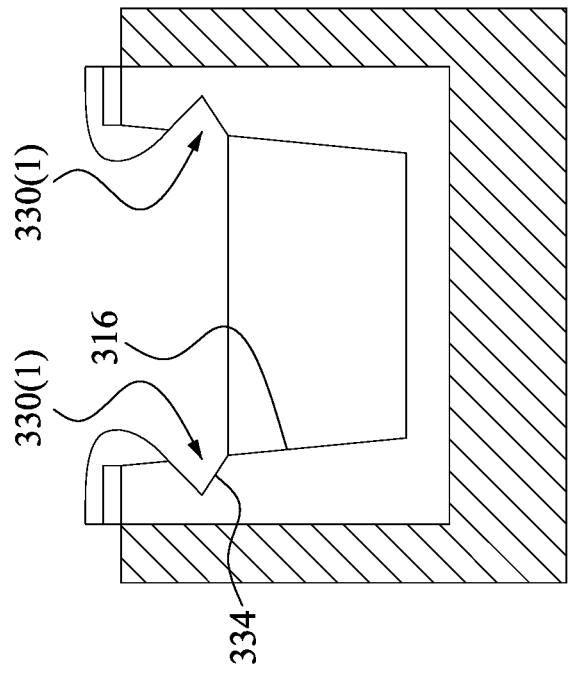
Figures 2, 3F:
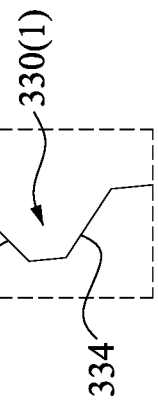
Figures 1, 3F:
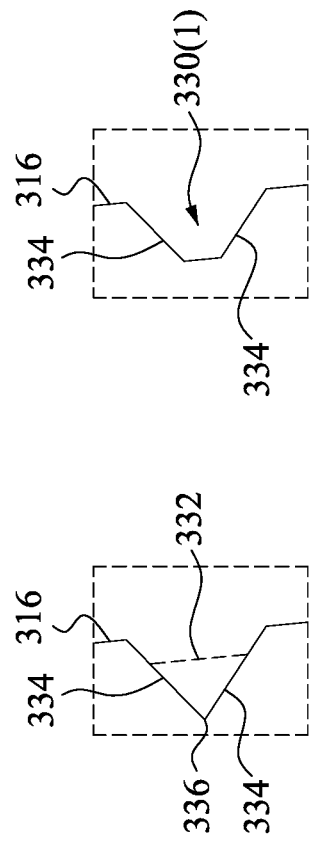

FIG. 1 is a cross-sectional view of an example integrated circuit structure (IC) 100 including a CMOS component. Referring to FIG. 1, the IC 100 includes a substrate 102 including an N-doped region (N-well) 104 and a P-doped region (P-well) 106. A first device 110, e.g., a PMOS, is formed within and over the N-well 104. A second device 150, e.g., an NMOS, is formed within and over the P-well 106. One or both of the first and second devices 110, 150 is adjacent to a respective insulation body 112, 152 within the respective N-well 104, P-well 106. FIG. 1 shows that the insulation bodies 112, 152 are separated from one another; however, embodiments of the present disclosure are not limited to insulation bodies 112, 152 being separated from one another. For example, in other embodiments it is possible that the insulation bodies 112, 152 contact one another. In other embodiments, one or more of the insulation bodies 112, 152 may be a semiconductor body of various semiconductor materials. Layers 113, 153 are adjacent to the insulation bodies 112, 152, respectively, and include either a same dielectric material as the insulation bodies 112, 152, i.e., layers 113, 153 may be an integrated part of the respective insulation bodies 112, 152, or may be a different layer from the insulation bodies 112, 152.

Further, the insulation bodies 112, 152 may be a same layer of dielectric material, e.g., the insulation bodies 112, 152 may be formed by a same deposition process of a same dielectric material. The insulation bodies 112, 152 are labelled with different numerals to indicate that they are associated with the first device 110 or the second device 150, respectively. In other embodiments, the insulation bodies 112, 152 are formed through different processes. The N-well 104 and the P-well 106 are optional. In some embodiments, as the insulation layers 112, 152, 113, 153 block charge carrier movements, one or more of the devices 110, 150 are not formed within doped regions 104, 106 and are formed in semiconductor substrate 102 directly.

The first device 110 and the second device 150 each include a vertical stack of a plurality of (two shown for illustration) discrete nanowire strips 120, 160 and a gate 130, 170 that wraps around the respective discrete nanowire strips 120, 160. The discrete nanowire strips 120, 160 are configured as channel regions of the devices 110, 150 and form junctions with respective source/drain regions 140, 180. The source/drain regions 140, 180 are separated from the respective gates 130, 170 by inner spacers 134, 174 and/or outer spacers 132, 172.

In an embodiment, the nanowire strips 120 are silicon germanium or other suitable semiconductor materials. The source/drain regions 140 are doped silicon germanium or other suitable semiconductor materials. The dopants are the elements such as boron, gallium, indium and the like in group III. The nanowire strips 160 are silicon or other suitable semiconductor materials. The source/drain regions 180 are doped silicon or other suitable semiconductor materials. The dopants are the elements such as arsenic, phosphorus and the like in group V.

FIG. 1 shows two embodiments of the source/drain structures 140, 180. In the embodiment shown with respect to source/drain structure 140, the source/drain structure 140 contacts the nanowire strips 120 by the edge surfaces of the nanowire strips 120. Further, the source/drain structure 140 is patterned to have a space 115 between the source/drain structure 140 and the sloped sidewall 114 of the insulation body 112. In the embodiment shown with respect to source/drain structure 180, the source/drain structure 180 extends all the way to the insulation body 152, or specifically into the recesses 156 on the sloped sidewall 154. Other structural configurations of the source/drain structure 140/180 and the semiconductor strips 120/160 are also possible and included in the disclosure. For example, the source/drain structures 140/180 may wrap around at least some of the nanowire strips 120/160. The nanowire strips 120, 160 may be receded (as shown with 120) or may extend all the way between recesses 156 of the insulation body 152 (and/or recesses 116 of the insulation body 112).

FIG. 1 shows an illustrative example of the source/drain structures 140, 180, which does not limit the scope of the disclosure. Other embodiments of the source/drain structures 140, 180 are also possible and included in the disclosure.

The substrate 102 may include a silicon substrate in crystalline structure and/or other elementary semiconductors like germanium. Alternatively or additionally, the substrate 102 may include a compound semiconductor such as silicon carbide, gallium arsenide, indium arsenide, and/or indium phosphide. Further, the substrate 102 may also include a silicon-on-insulator (SOI) structure. The substrate 102 may include an epitaxial layer and/or may be strained for performance enhancement.

The gate structures 130, 170 are each formed as a replacement metal gate. The following description lists examples of materials for the gate structures 130, 170. The gate electrodes of the gates 130, 170 each include a conductive material, e.g., a metal or a metal compound. Suitable metal materials for the gate electrode of the gate structures 130, 170 include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate electrodes of the gate structures 130, 170 each include a work function layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or combination thereof. In some examples, a conductive layer, such as an aluminum layer, a copper layer, a cobalt layer or a tungsten layer is formed over the work function layer such that the gate electrodes of gate structures 130, 170 each includes a work function layer disposed over the gate dielectric and a conductive layer disposed over the work function layer and below a gate cap (not shown for simplicity). In an example, the gate electrodes of the gate structures 130, 170 each have a thickness ranging from about 5 nm to about 40 nm depending on design requirements.

In example embodiments, gate dielectric layer includes an interfacial silicon oxide layer (not separately shown for simplicity), e.g., thermal or chemical oxide having a thickness ranging from about 5 to about 10 angstrom (A). In example embodiments, the gate dielectric layer further includes a high dielectric constant (high-k) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. A high-k dielectric material, in some applications, includes a dielectric constant (k) value larger than 6. Depending on design requirements, a dielectric material of a dielectric contact (k) value of 7 or higher is used. The high-k dielectric layer may be formed by atomic layer deposition (ALD) or other suitable technique. In accordance with embodiments described herein, the high-k dielectric layer of the gate dielectric layer includes a thickness ranging from about 10 to about 30 angstrom (A) or other suitable thickness.

In an embodiment, the outer spacers 132, 172 is formed of a low-k dielectric material such as silicon oxynitride (SiON), silicon monoxide (SiO), silicon oxynitrocarbide (SiONC), silicon oxycarbide (SiOC), vacuum, and other dielectrics or other suitable materials. The outer spacers 132, 172 may be formed through chemical vapor deposition (CVD), high density plasma CVD, spin-on, sputtering, or other suitable approaches.

In an embodiment, the inner spacers 134, 174 are formed of a low-k dielectric material, e.g., k value lower than 6. The low-k dielectric material of the inner spacers 134, 174 may have a different dielectric constant than that of the respective outer spacer 132, 172. The low-k material for the inner spacers 134, 174 includes one or more of silicon monoxide (SiO), silicon oxynitrocarbide (SiONC), silicon oxycarbide (SiOC), silicon carbide (SiC), or other suitable low-k dielectric material. In an embodiment, the k value of the inner spacer 134, 174 material is the same as the k value of the outer spacer 132, 172 material. In an example, the inner spacers 134, 174 also include one or more air gaps adjacent to one or more of the respective gate structures 130, 170 or the respective source/drain structures 140, 180.

The insulation or semiconductor bodies 112, 152 each includes a generally sloped sidewall 114, 154 (shown in dotted line). In an embodiment, an angle θ1, θ2 between the sloped sidewalls 114, 154 and upper surfaces 118, 158 of the insulation or semiconductor bodies 112, 152 is between about 65 degree to about 89 degree or other angles as described herein. Angles θ1, θ2 may be substantially the same or may have different values. A plurality of recesses 116, 156 are formed vertically stacked along the sidewalls 114, 154 of the insulation or semiconductor bodies 112, 152. A recess 116 on the insulation or semiconductor body 112 may be different in size from a recess 156 on the insulation or semiconductor body 152. Further, two immediately adjacent recesses 116a, 116b on the sloped sidewall 114 or 156a, 156b on the sloped sidewall 154 may have different sizes. As shown in FIG. 1-1, an enlarged view of recesses 116, 156, a size of recesses 116, 156 includes a thickness T and a depth D. Two recesses 116, 156 may be different in thickness, depth or both.

The insulation body 152 may include a same or a different dielectric material from the insulation body 112. The semiconductor body 112/152 may include a same or a different semiconductor material from the substrate 102.

In other embodiments, the insulation body 112 and the insulation body 152 may both be insulation bodies of same or different dielectric materials or both be semiconductor bodies of same or different semiconductor materials.

In another embodiment, the insulation bodies 112, 152 may be replaced with a semiconductor material that is either the same as or different from the semiconductor materials of the nanowire strips 120, 160.

The nanowire strips 120 and the nanowire strips 160 are formed from stacks of epitaxy layers that are formed separately by localized epitaxy growth. The nanowire strips 120 and the nanowire strips 160 may include different thickness. Further, an inner spacer 134, 174 of one of the first device 110 and the second device 150 may not laterally align with a nanowire strip 160, 120 of the other one of the first device 110 and the second device 150 because the sacrificial strips used in making one of the devices 110, 150 and the nanowire strips 120, 160 of the other one of the first device 110 and the second device 150 are not made from the same epitaxy layers. Note again that the nanowire strips 120 and the nanowire strips 160 are formed from stacks of epitaxy layers that are formed separately in localized epitaxy growth as described below in more detail.

FIG. 1 shows that the insulation bodies 112, 152 completely separate the first device 110 and the second device 150 from the substrate 102, which is not limiting. In other embodiments, one or more of the first device 110 and the second device 150 may extend through the insulation bodies 112, 152 toward the substrate 102.

FIG. 1 shows that the first device 110 and the second device 150 are both partially embedded within the respective N-well 104 or P-well 106 of the substrate 102, which is not limiting.

Further, one of the first device 110 and the second device 150 may be formed using other techniques, which are included in the present disclosure. For example, one of the first device 110 or the second device 150 may not include the respective recesses 116, 156 in the sidewall of the insulation body.

FIG. 1 shows that a dual-tub process is used, i.e., both P-well 106 and N-well 104 are formed in the substrate 102. Other processes, like a P-well process in an N-type substrate or an N-well process in a P-type substrate are also possible and included in the disclosure. That is, it is possible that one of the insulation bodies 112, 152 are embedded in a separately doped substrate region, either P-well or N-well, and the other one of the insulation bodies 112, 152 is embedded within the original substrate 102, either N-type or P-type.

In an embodiment, a space 113, 153 between the first device 110, the second device 150 and the respective insulation/semiconductor body 112, 152 may be a void, an air gap, may be fully or partially filled with a dielectric material, or may be fully or partially filled with a semiconductor material. The dielectric material in the space 113, 153 may be a same dielectric material as the respective insulation body 112 or may be a different dielectric material. Moreover, the space 113, 153 may be at least partially filled with a semiconductor material(s). The semiconductor material in the spaces 113, 153 may be a same semiconductor material as the respective source/drain structure 140, 180 or may be a different semiconductor material. Further, some of the recesses 116, 156 may be at least partially filled with semiconductor materials similar to that of the nanowire strips 120, 160.

In other embodiments, the space 113, 153 does not exist and the recesses 116, 156 are each adjacent to a semiconductor nanowire strip 120, 160, the respective source/drain structure 140, 180 or other nanowire strips, as shown in FIG. 1 with respect to the first device 110 and the second device 150, respectively.

FIG. 2 shows an example process of making an IC device, e.g., the example IC 100 of FIG. 1. FIGS. 3A-3M show, in cross-sectional views, different stages of a wafer 300 in the process of making the example IC 100 according to the example process of FIG. 2.

In example operation 205, a wafer 300 is received. FIG. 3A shows that wafer 300 includes a substrate 102 that includes an N-well 104 and a P-well 106 coplanar with one another at an upper surface 308 of the wafer 300. As an illustrative example, the substrate 102 is a silicon substrate. FIG. 3A shows, as a non-limiting illustrative example, wherein the N-well 104 and the P-well 106 interface with one another. The N-well 104 may be doped in various approaches with dopants/impurities of group V elements, like arsenic, phosphorous etc., or various combinations thereof. The P-well 106 may be doped in various approaches with dopants/impurities of group III elements, like boron, gallium etc., or various combinations thereof.

Referring back to FIG. 2, with reference also to FIG. 3B, in example operation 210, sacrificial substrate regions 310, 410 are formed within one or more of the N-well 104 and the P-well 106 using reduced pressure chemical vapor deposition (RP-CVD) or any other suitable approaches. The sacrificial substrate regions 310, 410 each include a material different from the substrate 102. For example, in an illustrative example, in the case that the substrate 102 is silicon, the sacrificial substrate regions 310, 410 are germanium.

In another embodiment, no sacrificial substrate regions are formed and the subsequent processes are performed with one or more of the N-well 104 or the P-well 106 instead.

In another embodiment, shallow trench isolation (STI) regions are formed between and/or within the N-well 104 or the P-well 106 and sacrificial substrate regions 310, 410 (or the original N-well 104, P-well 106) are then formed as a ring region surrounding the STI region in the N-well 104 or the P-well 106.

Referring back to FIG. 2, with reference also to FIG. 3C, in example operation 215, a trench 312, 412 is formed embedded in each of the sacrificial substrates 310, 410, and filled with a material different from the sacrificial substrates 310, 410. For example, the trenches 312, 412 are filled with a dielectric material like silicon oxide. In the description herein, reference numerals 312, 412 also refer to the dielectric material filled in the trenches 312, 412. With the formation of the trenches 312, 412, the remaining portions of the sacrificial substrate 310, 410 that surround the respective trenches 312, 412 are referred to as bank structures 314, 414, respectively.

Bank structures 314, 414 each include a sloped sidewall 316, 416. An angle θ3, θ4 between the sloped sidewall 316, 416 of the bank structures 314, 414 and the upper surface 308 is between about 65 degree to about 89 degree. Further, the angles θ3, θ4 are determined based on the determined facet angle of the epitaxy layers to be formed within the trenches 312, 412. Specifically, the angles θ3, θ4 are selected in a manner that the relevant sloped sidewalls 316, 416 are suitable to form recesses that fit the facet angle of the epitaxy layers. The importance of this range of angles is further described herein.

FIG. 3C shows that the trenches 312, 412 do not extend downward through the sacrificial substrate region 310, 410 and do not reach the substrate 102 or, more specifically, the N-well 104 or the P-well 106. In other embodiments, the trenches 312, 412 each extend through the respective sacrificial substrate regions 310, 410 and reach the substrate 102 or, more specifically, the N-well 104 or the P-well 106.

As described herein, the trenches 312, 412 may be formed before the sacrificial substrate regions 310, 410, which does not change the scope of the disclosure. Further the trenches 312, 412 may be formed within the N-well 104, P-well 106 directly without the sacrificial substrate regions 310, 410 being formed prior or subsequent thereto. In the description herein, the sacrificial regions 310, 410 are used, as illustrative examples, to illustrate the example processes. Similar processes also could be performed with trenches 312, 412 directly surrounded by the N-well 104, P-well 106 material.

Referring back to FIG. 2, with reference also to FIG. 3D, in example operation 220, with one of the sacrificial substrate region, here, e.g., sacrificial substrate region 410, covered by a hard mask layer 358 of, e.g., silicon carbide, a cap layer 320 is formed covering a corner portion 314C of the bank structures 314 in the other sacrificial substrate 310. As shown in FIG. 3D, the corner portion 314C includes a portion 316C of the sidewall 316 and a portion 308C of the upper surface 308. The cap layer 320 covers the sidewall portion 316C and the upper surface portion 308C of the corner portion 314C. In an embodiment, a pad oxide layer 322, is formed between the cap layer 320 and the upper surface portion 308C of the corner portion 314C. The pad oxide 322 may protect the corner portion 314C in the process of removing the cap layer 320. The cap layer 320 is silicon nitride or other suitable dielectric materials.

In forming the cap layer 320, an upper portion 312C (shown in dotted lines) of the trench materials 312 is removed.

In some of the figures described hereinafter, only the N-well 104 portion of the wafer 300 is shown for simplicity purposes. It is appreciated that similar descriptions also apply to the P-well 106 portion of the wafer 300 and can be carried out in a separate process.

Figure 3E:
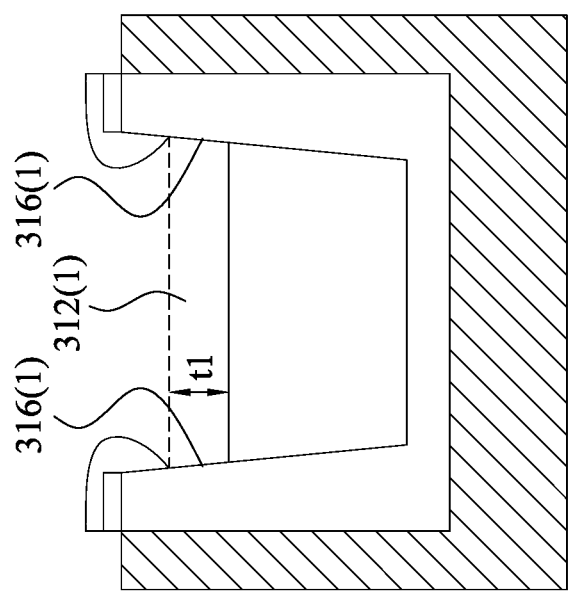

Referring back to FIG. 2, with reference also to FIG. 3E, in example operation 225, a first sidewall portion 316(1) is exposed by removing a first trench dielectric portion 312(1) of the trench 312 dielectric material. In an embodiment, the thickness $t_1$ of the removed first trench dielectric portion 312(1) is controlled to be substantially equal to a thickness of an epitaxy layer expected to be formed in the space of the removed first trench dielectric portion 312(1).

Referring back to FIG. 2, with reference also to FIG. 3F, in example operation 230, a first recess 330(1) is formed through the exposed first sidewall portion 316(1). In an embodiment, the first recess 330(1) has an angled profile and is formed based on the etchants having different etching rates among different crystallographic facets/planes of the sacrificial substrate 310 material, here germanium as an illustrative example. An angled profile refers to two planes that meet at a ridge interface. As shown in the enlarged view of FIG. 3F-1, the angled profile includes two planes 334 that meet at a ridge interface 336. A wet etch process or a reactive ion etch processes may be employed as a crystallographic anisotropic etch provided the etchant has an anisotropic etch rate along different crystallographic planes of the exposed sidewall portion 316(1). More specifically, the crystallographic facet 334 has a lower etch rate than a crystallographic plane 332 (shown in dotted line), as shown in the enlarged view of FIG. 3F-1. As the angle θ3 (FIG. 3C), between about 65 to about 89 degrees, is relatively close to 90 degree, the sidewall 316 is relatively in line with the crystallographic facet 332 and a proper angled recess 330(1) is formed based on the etch rate differences. A further smaller θ3 angle, e.g., smaller than 65 degree, may hamper the formation of the angled recess 330(1).

The profile of the angle recess 330(1) is controlled to fit or be in line with an angled facet edge portion of an epitaxy layer to be formed within the trench 312 and between the first recess 330(1).

The first recess 330(1) may also be formed with other profiles like semi-ellipsoid, which are all included in the disclosure. Further, it is also possible that depending on the etch timing, the etching stops before the high etch rate crystallographic facet 332 is reduced to reach the ridge interface 336. That is, the first recess 330(1) may include a trapezoid profile as shown in FIG. 3F-2.

Figure 3H:
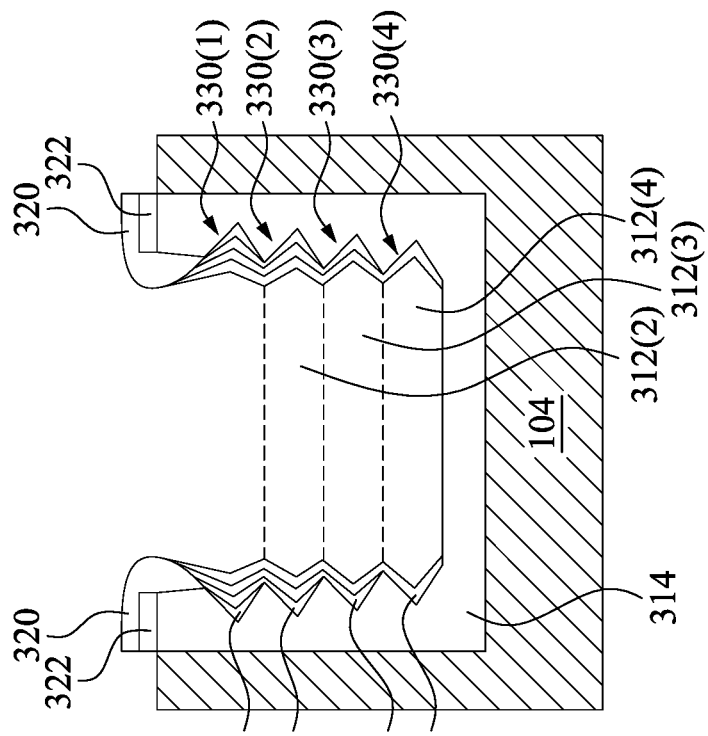
Figure 3G:
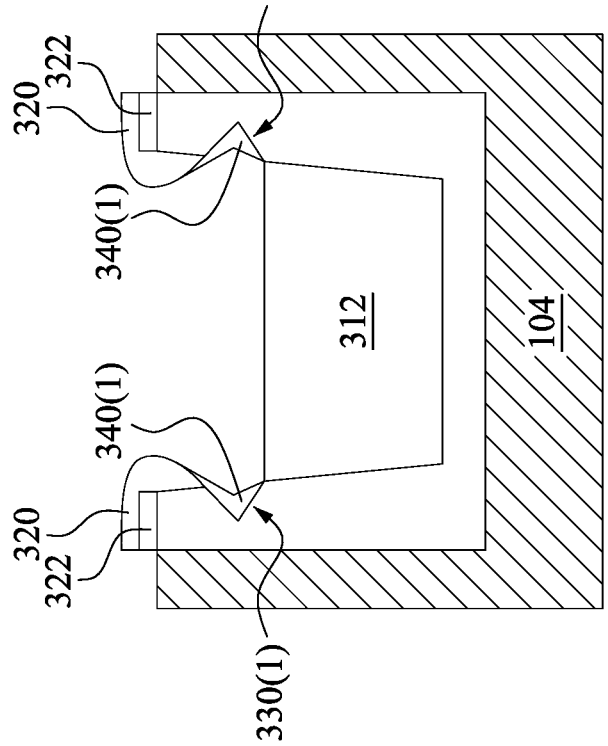

Referring back to FIG. 2, with reference also FIG. 3G, in example operation 235, a first cap layer 340(1) is formed covering the first recess 330(1). In an embodiment, the first cap layer 340(1) includes a dielectric material that is different from the trench 312 dielectric material such that the first cap layer 340(1) and the trench 312 dielectric material include etch selectivity from one another. In an embodiment, the cap layer 340(1) includes a same dielectric material as the cap layer 320, here, e.g., SiN. As shown in FIG. 3G, the first cap layer 340(1) also covers the sidewall portion 316C of the corner portion 314C, accumulating over the cap layer 320.

With reference to FIG. 3H, the sequence of the operations 225, 230, 235 are repeated for determined times such that a vertical stack of a plurality of recess 330, shown as four recesses 330(1), 330(2), 330(3) and 330(4), are formed along the sidewall 316 of the bank structure 314. In an embodiment, two immediately adjacent removed trench dielectric portions 312, e.g., 312(2) and 312(3), and the relevant exposed sidewall portions include different thickness. The alternate ones of the removed trench dielectric portions 312, e.g., 312(2) and 312(4), and the relevant exposed sidewall portions include a substantially same thickness. As a result, two immediately adjacent recesses 330, e.g., 330(2) and 330(3), include different sizes in one or more of the depth D or the thickness T (FIG. 1-1). Two alternate recesses 330, e.g., 330(2) and 330(4), include substantially a same size in both the depth D and the thickness T.

Each recess 330(1), 330(2), 330(3), 330(4) is covered by at least one cap layer 340, here 340(1), 340(2), 340(3) and 340(4). A recess 330 that is stacked higher along the sloped sidewall 316 is covered by more layers of the cap layers 340 than a recess 330 that is stacked lower along the sloped sidewall 316 because the cap layer 340 for a lower recess 330 also covers a higher recess 330. In other words, the cap layers 340 accumulate over a higher recess 330. This accumulation of cap layers 340 is enabled by the proper slope of the sloped sidewall 316, i.e., a properly formed angle θ3. For example, in an embodiment, angle θ3 is between about 65 degree to about 89 degree. For example, the cap layer 340(4) that is formed to cover the lowest recess 330(4) also covers the recesses 330(3), 330(2) and 330(1) that is higher than the recess 330(4). As a result, a higher recess 330 is covered by a thicker accumulation of dielectric materials, i.e., more layers of the cap layers 340, than a lower recess 330.

If the angle θ3 is higher than about 89 degree, the cap layers 340 may not effectively accumulate over a higher recess 330.

In an embodiment, the thickness of a removed trench 312 dielectric portion, e.g., 312(2) and the size of the respective recess 330(2) is controlled based on an epitaxy layer to be formed in the space of the removed trench 312 dielectric portion 312(2). A different material and/or crystalline orientation of the epitaxy layer may include a different angled facet edge portion. The conditions of the epitaxy process, e.g., temperature, may also affect the angled facet edge portion of the formed epitaxy layer. All these factors are considered in determining the size and or profile of the recesses 330 individually or as a group.

Figure 3J:
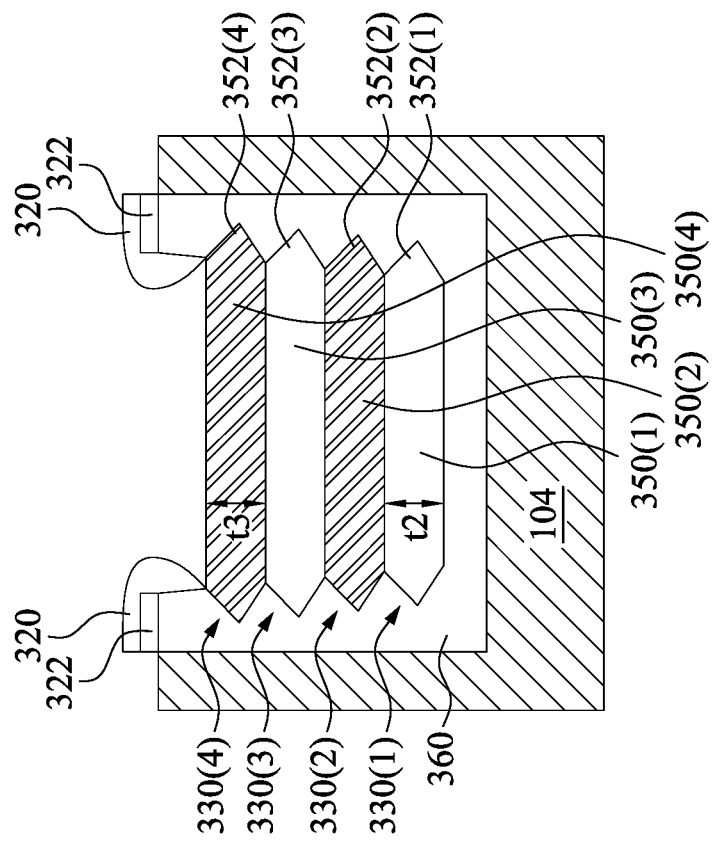
Figure 3I:
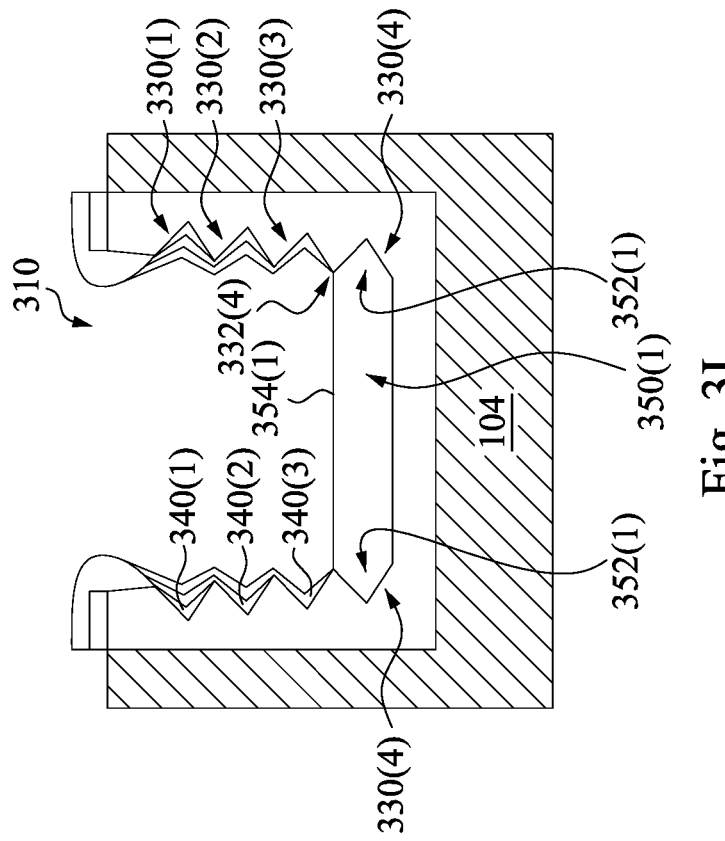
Figure 3I:
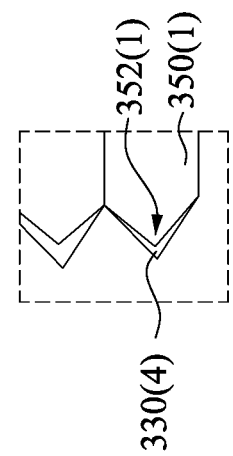

Referring back to FIG. 2, with reference also to FIG. 3I, in example operation 240, the lowest recess 330, here 330(4) is exposed by etching. The etching conditions are controlled such that the cap layer 340(4) that covers the lowest recess 330(4) is removed while the cap layer 340(3) that covers the immediately higher recess 330(3) still remains and the immediately higher recess 330(3) remains covered. Due to the accumulations of the cap layers 340, the even higher recesses 330(2) and 330(1) also remain covered.

In example operation 245, an epitaxy layer 350(1) is formed in the trench 310 with the facet edge 352(1) of the epitaxy layer 350(1) aligning into the angled recess 330(4). The epitaxy layer 350(1) includes a first semiconductor material, e.g., silicon. In an embodiment, the epitaxy process includes an etching component that prevents the silicon growth via the interface of the cap layer 340. As a result, the epitaxy layer 350(1) does not extend beyond the upper edge 332(4) of the recess 330(4). Further, the thickness of the epitaxy layer 350(1) is monitored in-situ during the epitaxy process through, e.g., oscillating quartz resonators. Such monitoring provides substantially real-time feedback to the thickness control in the thin film deposition component of the epitaxy process. Therefore, precise control of the thickness of the epitaxy layer 350(1) is enhanced by optimizing the epitaxy parameters dynamically during the deposition process through the real time monitoring and feedback approaches.

As the facet edge 352(1) of the epitaxy layer 350(1) aligns into the angled recess 330(4), the upper surface 354(1) of the epitaxy layer 350(1) is substantially flat. The epitaxy layer 350(1) thus extends substantially all the way throughout the space defined by the upper edge 332(4) of the recess 330(4). By aligning into the angled recess 330(4), the facet edge 352(1) of the epitaxy layer 350(1) does not need to perfectly fit into the recess 330(4). In an embodiment, even if the facet edge 352(1) of the epitaxy layer 350(1) does not perfectly fit into the recess 330(4), the flatness of the surface 354(1) is improved. In another embodiment, the profile of the recess 330(4) is controlled such that the facet edge portion 352(1) of the epitaxy layer 350(1) is fully contained within the recess 330(4), as shown in FIG. 3I-1. For example, the etch rate differences between the facet 332 and the facet 334 of the recess 330 may be controlled/selected to achieve the desired profile of the recess 330 (FIG. 3F-1).

Referring to FIG. 3J, the sequence of the operations 240 and 245 are repeated to form epitaxy layers 350(2), 350(3), 350(4) as a stack of epitaxy layers within the trench 310. The facet edge portions 352(2), 352(3), 352(4) of each of the epitaxy layers 350(2), 350(3), 350(4), respectively align into the respective recesses 330(3), 330(2), 330(1).

The immediately adjacent epitaxy layers 350, e.g., 350(2) and 350(3), include different semiconductor materials. The alternate epitaxy layers 350, e.g., 350(2) and 350(4) include a same semiconductor material. In an embodiment, epitaxy layers 350(1) and 350(3) are silicon or other suitable semiconductor materials. Epitaxy layers 350(2) and 350(4) are silicon germanium or other suitable semiconductor materials. The epitaxy layers 350(1), 350(3) of silicon include a same thickness of $t_2$. The epitaxy layers 350(2), 350(4) of silicon germanium include a same thickness of $t_3$. $t_2$ may or may not equal to $t_3$ depending on device and/or circuit design. $t_3$ is substantially equal to $t_1$ (FIG. 3E), as provided by the fabrication process. As such, basically, the stack of epitaxy layers 350 includes silicon layers 350(1), 350(3) and silicon germanium layers 350(2), 350(4) stacked in an alternating sequence. The thickness $t_2$ of the silicon epitaxy layers 350(1), 350(3) and the thickness $t_1$ of the silicon germanium epitaxy layers 350(2), 350(4) are determined based on the specific device design. In a GAA process, one type of the epitaxy layers, either the silicon epitaxy layers 350(1), 350(3) or the silicon germanium epitaxy layers 350(2), 350(4) will be used to form the channel layer of a transistor device, and the other type will be used as sacrificial layers.

Because the edge portions of each of the epitaxy layers 350 align into the respective recesses 330, each epitaxy layer 350 is substantially flat and extends all the way laterally within the trench 312.

Figure 3L:
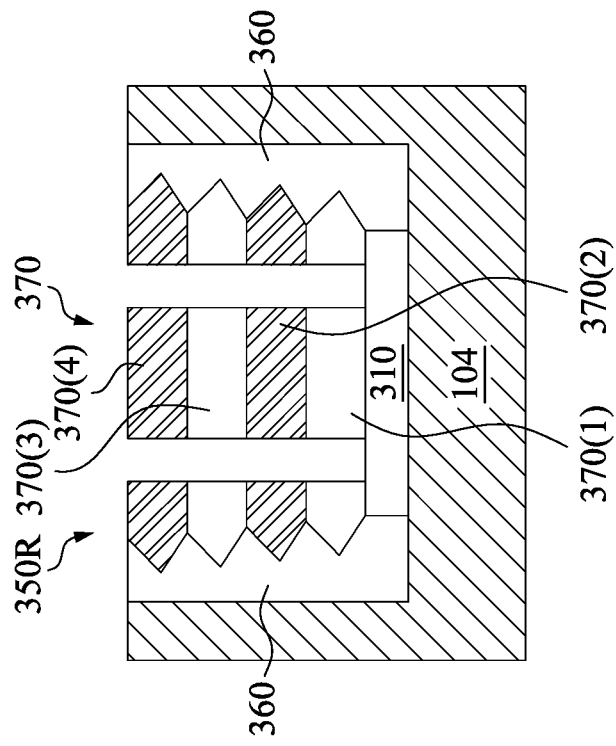
Figure 3K:
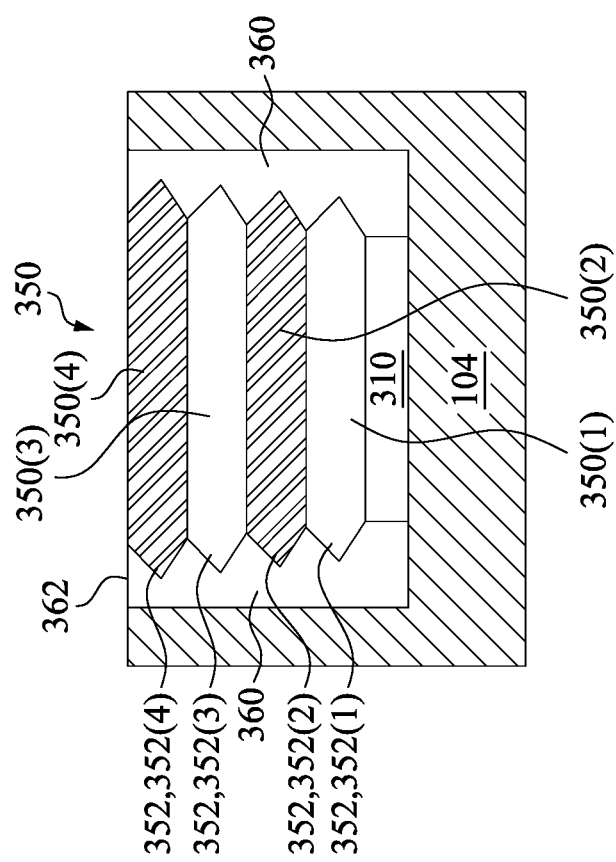

Referring back to FIG. 2, with reference also to FIG. 3K, in example operation 250, the sacrificial substrate region 310 is at least partially removed. The bank structure 314 of the sacrificial substrate 310 may be removed separately from the portion of the sacrificial substrate 310 positioned below the trench 312. In an embodiment, the dielectric material may be formed in the trench 312. In another embodiment, the sacrificial substrate 310 material below the trench 312 may remain. Specifically, the cap layer 320 and the pad oxide layer 322 are removed sequentially to expose the sacrificial substrate 310. The sacrificial substrate 310, e.g., of germanium, is selectively etched out while the epitaxy layers 350 remain. The dielectric layer 360 is then deposited within the space vacated by removing the sacrificial substrate 310. As such, the dielectric layer 360 also includes the recesses that interface with the facet edge portions 352 of the epitaxy layers 350.

In other embodiments, the "sacrificial" substrate region 310 is not removed. Further, as described herein, in other embodiments there is no sacrificial substrate region 310 formed and the epitaxy layers 350 are formed using the processes described herein directly within the N-well 104.

FIG. 3K shows that a planarization process, e.g., a CMP, is conducted to make an upper surface 362 of the dielectric layer 360 coplanar with, e.g., at substantially a same level as, the topmost epitaxy layer 350, here 350(4) of silicon germanium, which does not limit the scope of the disclosure.

Referring back to FIG. 2, with reference also to FIG. 3L, in example operation 255, the stack of epitaxy layers 350 are patterned to form a stack of nanowire strips 370 including silicon nanowire strips 370(1), 370(3) and silicon germanium nanowire strips 370(2), 370(4). The facet edge portions 350R of the epitaxy layers 350 may remain within the recesses of the dielectric layer 360 or may be removed.

Figure 3M:
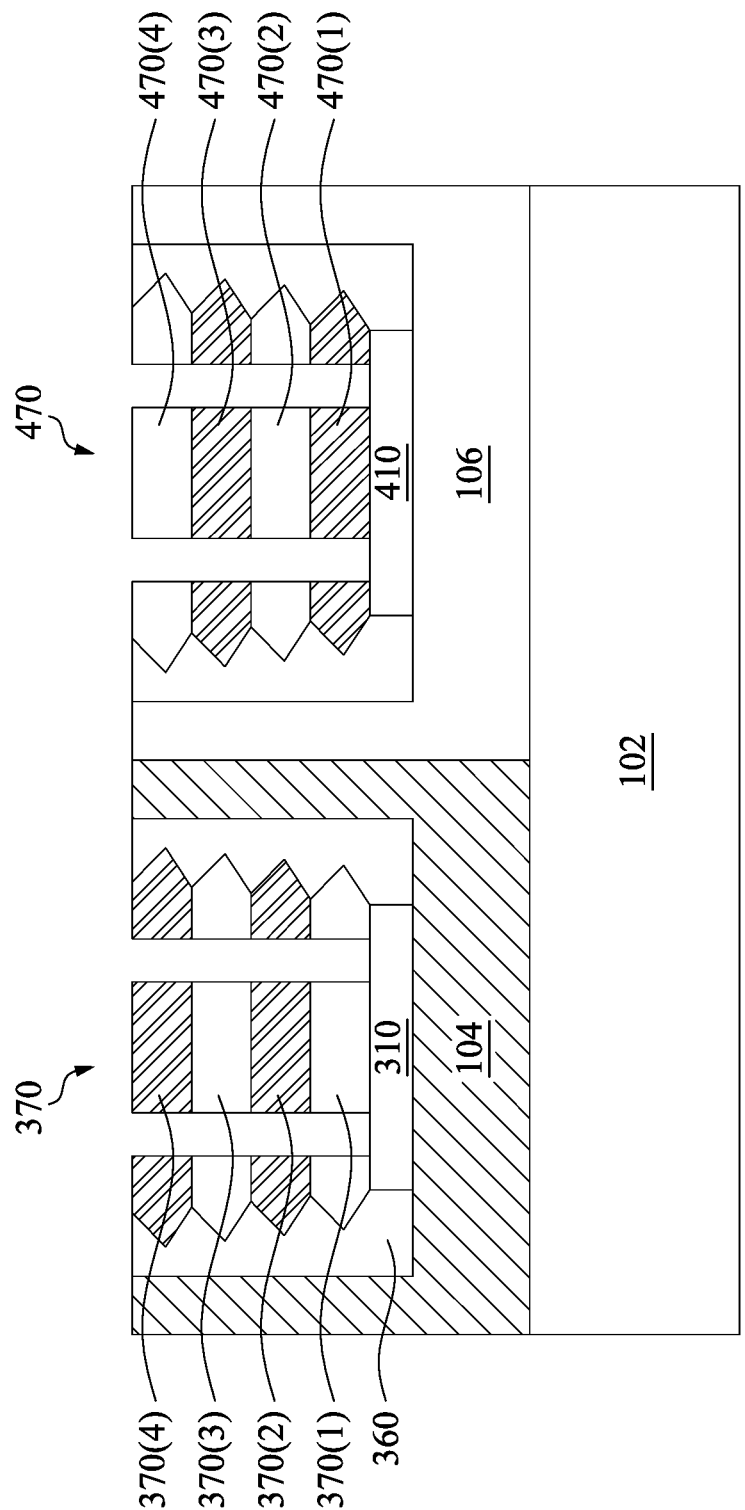

Similar processes are also conducted in the P-well 106 to generate a nanowire stack 470. As shown in FIG. 3M, the nanowire stack 470 includes silicon germanium nanowire strips 470(1), 470(3) and silicon nanowire strips 470(2), 470(4) stacked in an alternating sequence, with the silicon nanowire strip 470(4) stacked as the topmost one. As the nanowire stack 470 is made separately from the nanowire stack 370, the sequential orders of the nanowire strips 470 could be different from the sequential orders of the nanowire strips 370. For example, as illustratively shown in FIG. 3M, the topmost nanowire strip in the nanowire stack 370 is a silicon germanium nanowire strip 370(4) and the topmost nanowire strip in the nanowire stack 470 is a silicon nanowire strip 470(4). Further, the thickness of the silicon nanowire strip 470(4), 470(2) may be different from the thickness of the silicon nanowire strips 370(3), 370(1). Similarly, the thickness of the silicon germanium nanowire strip 470(3), 470(1) may be different from the thickness of the silicon germanium nanowire strips 370(4), 370(2). Within each nanowire stack 370, 470, the silicon nanowire strips may include a different thickness from the silicon germanium nanowire strips. Further, in an embodiment, the silicon germanium nanowire strip 370(4), 370(2) do not align with the silicon germanium nanowires 470(3), 470(1) and do not align with the silicon nanowire strips 470(4) and 470(2). For example, the center lines of these nanowire strips may be offset with one another. The silicon nanowire strips 370(3), 370(1) do not align with the silicon nanowire strips 470(4), 470(2) and do not align with the silicon germanium nanowire strips 470(3) and 470(1). All the thickness of the nanowire strips may be optimized separately for the nanowire stack 370 and the nanowire stack 470 depending on the devices to be made therefrom.

In an example, the nanowire stack 370 is used to make a PMOS device with the channel regions made from the silicon germanium nanowire strips 370(2), 370(4). The silicon nanowire strips 370(1), 370(3) are removed as sacrificial strips and are replaced with a gate structure. As such, the gate structure surrounds the surfaces of the silicon germanium nanowire strips in a resultant PMOS transistor.

The nanowire stack 470 is used to make a NMOS device with the channel regions made from the silicon nanowire strips 470(2), 470(4). The silicon germanium nanowire strips 470(1), 470(3) are removed as sacrificial strips and are replaced with a gate structure. As such, the gate structure surrounds the surfaces of the silicon nanowire strips in a resultant NMOS transistor.

FIG. 1 shows an example CMOS component of an integrated circuit made from the wafer 300. The example process 200 of FIG. 2 may be used to make the example structure 100 of FIG. 1 and/or other structures/devices, which are all included in the disclosure. Note that in FIG. 1, the sequence of the nanowire strips 160 is different from the sequential order of the nanowire stack 470 shown in FIG. 3M. As described herein, the sequential orders, the materials, and the thickness or other parameters of the nanowire strips in a locally formed nanowire stack 370, 470 could be customized and optimized for each sacrificial substrate region 310, 410 and based on the design requirements. Such flexibility is advantageous in improving the device performance of PMOS and NMOS devices separately and individually. Further, the insulation layers 360, 460 are integrated in the formation of the nanowire stacks 370, 470, which simplifies the integration of the CMOS process into a high voltage analog process like a bipolar-CMOS-DMOS (BCD) process.

Further, the disclosed technique of forming the epitaxy layers resolves the problems caused by the angled facet edge portion of an epitaxy layer. The resultant epitaxy layers are substantially flat and extend throughout the trench of the local epitaxy growth region, i.e., the sacrificial substrate region. Therefore, the product quality is improved and the pitch sizes between devices can be further reduced.

The present disclosure may be further appreciated with the description of the following embodiments:

In an embodiment, an integrated circuit includes a substrate, a first device, a second device and a first insulation structure that is positioned between the first device and the second device. The first device includes a first stack of discrete nanowire structures of a first semiconductor material over the substrate, and a first gate structure surrounding the first stack of discrete nanowire structures. The second device includes a second stack of discrete nanowire structures of a second semiconductor material over the substrate, and a second gate structure surrounding the second stack of discrete nanowire structures.

In another embodiment, a method includes forming a second substrate region within a first substrate region. A trench is formed within the second substrate region and a bank structure of the second substrate region is formed surrounding the trench. The bank structure includes a sloping sidewall portion and an upper corner. The trench is filled with a material different from the second substrate region. A first sidewall portion of the sloping sidewall is exposed. A first recess is formed on the exposed first sidewall portion. A first dielectric cap layer is formed covering the first recess. A second sidewall portion of the sloping sidewall is exposed. The second sidewall portion is below the first sidewall portion. A second recess is formed on the exposed second sidewall portion below the first angled recess. A second dielectric cap layer is formed covering the second recess and extending over the first dielectric cap layer. The second recess is exposed with the first recess remaining covered. A first semiconductor epitaxy layer is formed in the trench with a facet edge portion of the first semiconductor epitaxy layer aligning into the second recess. The first angled recess is exposed. A second semiconductor epitaxy layer is formed in the trench over the first semiconductor epitaxy layer, with a facet edge portion of the second semiconductor epitaxy layer aligning into the first recess.

In further embodiments, a method includes receiving a wafer, the wafer including a substrate having a P-well and an N-well. A first substrate body is formed in the P-well and a second substrate body is formed in the N-well. A first trench is formed in the first substrate body and a second trench is formed in the second substrate body. The first trench and the second trench both have sloping sidewalls. A first recess is formed on the sloping sidewall of the first trench. A second recess is formed on the sloping sidewall of the second trench. The second recess has a different thickness from the first recess. A first epitaxy layer of a first semiconductor material is formed in the first trench, with a facet edge portion of the first semiconductor epitaxy layer extending into the first recess. A second epitaxy layer of the first semiconductor material is formed in the second trench, with a facet edge portion of the second semiconductor epitaxy layer extending into the second recess. The second epitaxy layer has a different thickness than the first epitaxy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit, comprising:
   a substrate;
   a first device, the first device including a first stack of discrete nanowire structures of a first semiconductor material over the substrate, a first source/drain region adjacent the first stack of discrete nanowire structures, and a first gate structure surrounding the first stack of discrete nanowire structures;
   a second device, the second device including a second stack of discrete nanowire structures of a second semiconductor material over the substrate, a second source/drain region adjacent the second stack of discrete nanowire structures, and a second gate structure surrounding the second stack of discrete nanowire structures; and
   a first insulation structure positioned laterally of the first source/drain region, wherein a sidewall of the first insulation structure is faceted, the sidewall of the first insulation structure facing away from the first source/drain region.

2. The integrated circuit of claim 1, further comprising a second insulation structure positioned laterally between the first device and the second device or vertically between the substrate and the second device.

3. The integrated circuit of claim 2, wherein the first insulation structure is embedded within a first doped region of the substrate.

4. The integrated circuit of claim 3, wherein the second insulation structure is embedded within a second doped region of the substrate.

5. The integrated circuit of claim 1, wherein the first stack of discrete nanowire structures includes a first discrete nanowire structure and a second discrete nanowire structure vertically adjacent to the first discrete nanowire structure, the second discrete nanowire structure being vertically separated from the first discrete nanowire structure by a portion of the first gate structure, and a thickness of the portion of the first gate structure being different from a thickness of a third discrete nanowire structure of the second stack of discrete nanowire structures in a vertical direction.

6. The integrated circuit of claim 1, wherein the first semiconductor material is silicon and the second semiconductor material is silicon germanium.

7. An integrated circuit, comprising:
   a substrate;
   a first dielectric region in the substrate;
   a second dielectric region in the substrate, wherein the first dielectric region and the second dielectric region share a faceted interface;
   a first source/drain region adjacent the second dielectric region;
   a first stack of discrete nanostructures of a first semiconductor material adjacent the first source/drain region; and
   a first gate structure surrounding the first stack of discrete nanostructures.

8. The integrated circuit of claim 7, further comprising a semiconductor region interposed between the first stack of discrete nanostructures and the substrate, wherein the semiconductor region and the substrate comprise different semiconductor materials.

9. The integrated circuit of claim 8, wherein the second dielectric region contacts an upper surface of the semiconductor region.

10. The integrated circuit of claim 9, wherein the first dielectric region extends along a sidewall of the semiconductor region.

11. The integrated circuit of claim 8, wherein a width of the semiconductor region is greater than a width of the first stack of discrete nanostructures.

12. The integrated circuit of claim 7, wherein the first source/drain region and the second dielectric region share a non-faceted interface.

13. The integrated circuit of claim 7, wherein a first lateral distance between a first nanostructure of the first stack of discrete nanostructures is less than a second lateral distance between a second nanostructure of the first stack of discrete nanostructures, wherein the first nanostructure is interposed between the second nanostructure and the substrate.

14. An integrated circuit, comprising:
a substrate;
a first region in the substrate, the first region having a first sidewall, the first sidewall having a plurality of recesses, the first region being a different material than the substrate;
a first stack of discrete nanostructures of a first semiconductor material;
a first source/drain region adjacent the first stack of discrete nanostructures;
a first dielectric region interposed between the first source/drain region and the first region, wherein the first dielectric region extends into the plurality of recesses in the first sidewall of the first region; and
a first gate structure surrounding the first stack of discrete nanostructures.

15. The integrated circuit of claim 14, wherein the first region comprises a dielectric material.

16. The integrated circuit of claim 15, wherein the first region extends under the first stack of discrete nanostructures.

17. The integrated circuit of claim 15, wherein the first region extends under the first gate structure.

18. The integrated circuit of claim 15, further comprising a first semiconductor region interposed between a bottom of the first stack of discrete nanostructures and the substrate.

19. The integrated circuit of claim 18, wherein the first region extends along sidewalls of the first semiconductor region.

20. The integrated circuit of claim 14, wherein the first region comprises a semiconductor material.

* * * * *